United States Patent
Schelstraete (10) Patent No.: US 8,335,968 B1
(45) Date of Patent: Dec. 18, 2012

(54) METHOD AND APPARATUS FOR DETERMINING CODEWORD INTERLEAVER PARAMETERS

(75) Inventor: Sigurd Schelstraete, Mountain View, CA (US)

(73) Assignee: Ikanos Communications, Inc., Fremont, CA (US)

(*) Notice: Subject to any disclaimer, the term of this patent is extended or adjusted under 35 U.S.C. 154(b) by 1212 days.

(21) Appl. No.: 12/215,000

(22) Filed: Jun. 24, 2008

Related U.S. Application Data (63) Continuation of application No. 11/193,832, filed on Jul. 28, 2005, now Pat. No. 7,409,626.

(60) Provisional application No. 60/591,991, filed on Jul. 28, 2004.

(51) Int. Cl.
*H03M 13/00* (2006.01)

(52) U.S. Cl. .................................. 714/774; 714/779

(58) Field of Classification Search .................. 714/774, 714/779

See application file for complete search history.

(56) References Cited

U.S. PATENT DOCUMENTS

| | | | |
|---|---|---|---|
| 5,995,540 A | 11/1999 | Draganic | |
| 6,088,337 A | 7/2000 | Eastmond et al. | |
| 6,167,121 A | 12/2000 | Arai | |
| 6,480,976 B1* | 11/2002 | Pan et al. | 714/701 |
| 6,971,057 B1* | 11/2005 | Delvaux et al. | 714/788 |
| 7,050,419 B2* | 5/2006 | Azenkot et al. | 370/347 |
| 2005/0138524 A1* | 6/2005 | Cioffi | 714/758 |

\* cited by examiner

*Primary Examiner* — M. Mujtaba K Chaudry
(74) *Attorney, Agent, or Firm* — Pillsbury Winthrop Shaw Pittman LLP (57) ABSTRACT

Modem selection of codeword interleaver parameters given standard based, operator based and channel based communication channel performance constraints. A processor implements processes for characterizing the forward error correction codeword and interleaver solution space in terms of expressions from which targeted portions of the solution space may be identified prior to evaluation of the magnitude of the coefficients of the corresponding nodes thereof for compliance with the to communication channel performance constraints.

12 Claims, 6 Drawing Sheets

FIG. 6 Latency and INP as Functions of I and M

FIG. 7

METHOD AND APPARATUS FOR DETERMINING CODEWORD INTERLEAVER PARAMETERS

CROSS REFERENCE TO RELATED APPLICATION

This application is a continuation of prior filed U.S. Utility patent application Ser. No. 11/193,832 filed Jul. 28, 2005 entitled now U.S. Pat. No. 7,409,626 "Method and Apparatus for Determining Codeword Interleaver Parameters", which claims the benefit of prior filed Provisional Application No. 60/591,991 filed on Jul. 28, 2004 entitled "Simple Search Algorithm for Interleaver Parameters" both of which are incorporated herein by reference in their entirety as if fully set forth herein.

BACKGROUND OF THE INVENTION

1. Field of Invention

The present invention is generally related to modems, and more particularly to digital modems.

2. Description of the Related Art

Digital subscriber line (DSL) technologies are being called on to provide large bandwidth, e.g. up to 100 Mbps links to homes and offices, for video on demand, teleconferencing, and other high throughput applications. To meet these elevated data rates DSL communications protocols such as discrete multitone (DMT) have been developed. In DMT communications each channel is split into sub-channels each with its own tone or sub-carrier to which a corresponding number of bits of the communication stream is assigned. The errorless transport of these bits on communication channels with low signal to noise ratios necessitated by the high data rates, requires extensive error correction overhead, which add redundant bits to the transmitted data to aid in the recovery of the errored data at the receiver. Forward error correction is typically combined with interleaving which provides additional levels of protection to what is known as 'impulse noise' on the communication channel. Interleaving spreads adjacent bits in the transmit stream over intervals greater than the duration of expected impulse noise thereby improving the error-correction performance.

Both interleave and forward error correction parameters vary depending on the communication standard, operator constraints and line constraints. Adjustments to one parameter typically effect others, and may significantly alter the performance of the communication channel.

What is needed are means for quickly and precisely determining the optimal parameters for encoding and interleaving the data on a communication channel.

SUMMARY OF THE INVENTION

A method and apparatus for selection of codeword interleaver parameters in a modem or other communication device given standard based, operator based and channel based constraints. A modem having shared and discrete components forming a transmit path and a receive path is disclosed. The modem is configured to couple to a communication medium for establishing a communication channel thereon. The modem includes: a forward error correction encoder component, an interleaver component and a processor. The forward error correction encoder component on the transmit path has configurable to codeword length 'N' and redundancy 'R' parameters for the forward error correction encoding of the communication channel into codewords. The interleaver component couples to the forward error correction encoder component for interleaving the codewords. The interleaver component has configurable interleaver block length 'I' and interleaver depth 'M' parameters. The processor couples to the transmit and receive path components including the forward error correction encoder and interleaver components. The processor is configured to characterize a forward error correction codeword and interleaver solution space in terms of expressions from which targeted portions of the solution space may be identified prior to evaluation of the magnitude of the coefficients of the corresponding nodes thereof for compliance with communication channel performance constraints.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION OF THE EMBODIMENTS

A method and apparatus for determining codeword interleaver parameters is disclosed. All digital communication experiences signal interference, and communication protocols which support multiple sub-channels such as discrete multi tone (DMT) and orthogonal frequency division multiplexed (OFDM) are no exception. Interference can effect both the amplitude and the phase of the sub-channels. At the receiver the data has to be separated from the noise. One popular technique for achieving the separation of data from the noise in a received signal is known as in-channel forward error correction (FEC). FEC introduces additional redundant bits into communications to between modems and additional processing overhead to handle the transmission and reception of a stream of digital information. The redundant bits are added at the transmitter by application of any of a number of FEC algorithms in a process known as encoding the data. At the receiver the same algorithm is performed to detect and remove errors in the transmitted data in a process known as decoding the signal.

With each improvement in bandwidth of multiple sub-channel communication systems there is a corresponding increase in noise, with the potential to reduce signal integrity to unacceptable levels. The modem of the current invention provides the signal integrity required to support high transmission rates and service level requirements.

In each of the Figures the reference numbers for elements introduced in each Figure correspond with the number of the Figure. For example elements referenced in FIG. 1 have reference numbers between 100-199. Elements referenced in FIG. 2 have reference numbers between 200-299, and so forth. For purposes of clarity elements first referenced in an earlier Figure may again appear in a subsequent figure.

Figure 1:
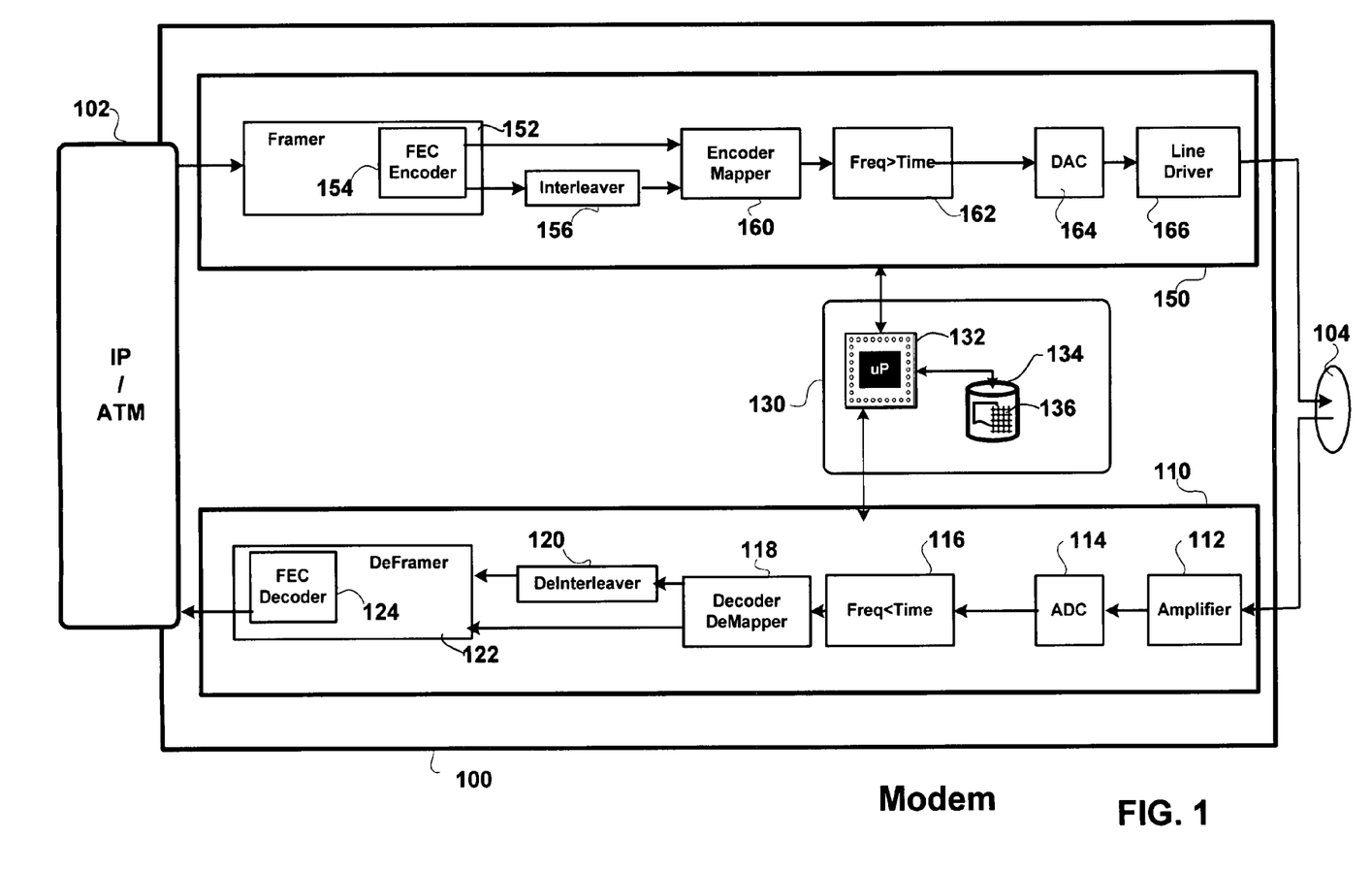
FIG. 1 is a hardware block diagram of a modem with codeword interleaver parameter determination in accordance with an embodiment of the invention.

FIG. 1 is a hardware block diagram of a modem 100 with codeword interleaver parameter determination in accordance with an embodiment of the invention. The modem includes a plurality of shared and discrete components coupled to one another to form a transmit path 150 and a receive path 110. In the embodiment shown the modem is configured to couple an Asynchronous Transfer Mode (ATM) or Transport Control Protocol/Internet Protocol (TCP/IP) network (not shown) to a wired or wireless communication medium 104. The transmit and receive path couple on one end to a communications medium 104, e.g. an X-DSL communications medium such as a subscriber line, and on the other end to an packet or cell based network via interface 102. The transmit and receive path components operate under the control of a processor component 130. The processor component handles the modem setup and interface between the transmit and receive paths, including in an embodiment of the invention the determination of codeword and interleaver parameters. The processor component includes a processor 132, memory 134 and associated program code and lookup tables 136. The processor component in an embodiment of the invention implements the processes for characterizing the codeword interleaver solution space and finding targeted nodes therein for which the codeword and interleaver parameters satisfy the various constraints on the communication channel(s) supported by the transmit and receive paths of the modem.

The components of this embodiment of the transmit path include a framer 152, an interleaver 156 and encoder/mapper 160, a frequency-to-time domain converter 162, a digital-to-analog (DAC) converter 164 and a line driver 166. The framer includes a forward error correction (FEC) encoder 154. The components of this embodiment of the receive path include a low noise amplifier 112, an analog-to-digital (ADC) converter 114, a time-to-frequency domain converter 116, a decoder/demapper 118, a deinterleaver 120 and a de-framer 122. The deframer includes a FEC decoder 124.

FEC encoding is used to assist the receiver in checking for and recovering data received in error. FEC encoding in general introduces redundancy into the transmitted data stream, to allow such error recovery without retransmission of data. FEC encoding may be implemented as a single type, e.g. block or convolutional, or as one or more types operating in combination. In an embodiment of the invention shown in FIG. 1, the FEC encoder 154 and decoder 124 implement a block type code identified as Reed-Solomon encoding.

The FEC encoder 154 and the FEC decoder 124 on the transmit path and receive paths respectively, include configurable codeword length 'N' and redundancy 'R' parameters for FEC encoding and decoding of the communication channel. The interleaver 156 and the deinterleaver 120 on the transmit and receive paths respectively, include configurable interleaver block length 'I' and interleaver depth 'M' parameters.

The processor couples to the transmit and receive path components including the FEC encoder, FEC decoder, interleaver and deinterleaver components. The processor is configured to characterize the multi-dimensional FEC codeword and interleaver solution space in terms of expressions from which targeted portions of the solution space may be identified prior to evaluation of the magnitude of the coefficients of the corresponding nodes thereof for compliance with communication channel performance constraints.

The components of the modem shown in this embodiment of the invention, particularly the frequency-to-time and time-to-frequency domain components are compatible with multi-tone modulation protocols such as: discrete multi-tone (DMT) and orthogonal frequency division multiplexed (OFDM) modulation protocols. In alternate embodiments of the invention in which the modem supports single carrier or carrierless modulation protocols such as: AM/PM (CAP) such component would not be required. The codeword interleaver parameter determination processes disclosed in the following drawings and accompanying text are equally compatible with a range of wired and wireless communication devices including but not limited to modems such as that shown in FIG. 1.

Figure 2:
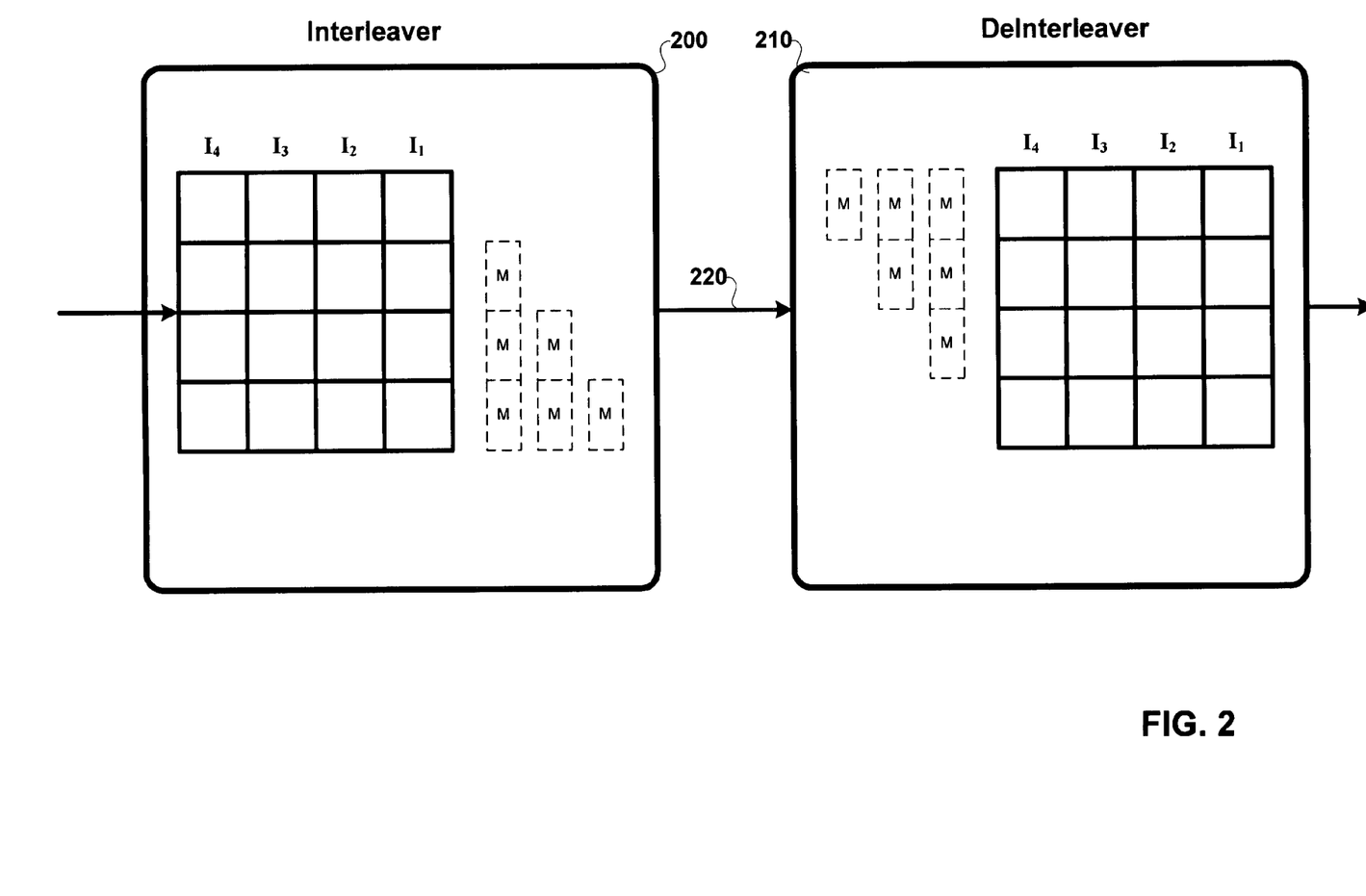
FIG. 2 is a hardware block diagram of an opposing interleaver and deinterleavers suitable for use in accordance with an embodiment of the invention.

FIG. 2 is a hardware block diagram of an opposing interleaver 200 and deinterleaver 210 coupled to one another across a communication medium 220. These components would be part of the transmit path and receive path respectively, of an opposing pair of wireless or wired, communication devices such as the modem shown in FIG. 1. Complex high speed communications protocols typically call for one or more communication paths at least one of which implements interleaving to reduce errors due to impulse or other intermittent noise types. Interleavers are used to reduce the effect of impulse noise by distributing adjacent bytes across a transmission interval greater than the expected impulse noise intervals. Interleaving is typically used with communication systems which also implement some form of forward error correction (FEC) with the FEC encoder providing the input to the interleaver.

A typical convolutional interleaver such as that shown in FIG. 2 is characterized by interleaver depth(D), interleaving depth parameter (M) and interleave block size (I). The relationship between these parameters is given in the following Equation 1:

$$D = MI + 1 \qquad \text{Equation 1}$$

Increasing the interleaver depth improves the error correction capability of a given system with a concomitant increase in latency. Latency corresponds to the time required for data to traverse the end-to-end communication path between opposing interleavers. For certain types of data such as text files significant increases in latency may be tolerable. For other types of 'real time' data such as audio or video data significant increases in latency can not be tolerated.

The embodiment of the interleaver shown in FIG. 2 is a triangular interleaver which is a convolutional type interleaver. As a general rule, the parameters I and D have to be co-prime, i.e. can not have a common divisor. In an embodiment of the invention such an interleaver may be implemented as a number of parallel delay lines as shown in FIG. 2. Interleave path data is split in consecutive blocks of I bytes. Within each block of I bytes, each byte is delayed with an amount that increments linearly with the byte index in the block. More specifically, byte j within the block is delayed with $\Delta_j$, as given in Equation 2:

$$\Delta_j = (D-1) \times j \qquad \text{Equation 2}$$

The incoming byte stream $b_i$ is mapped to an outgoing byte stream $b\phi_{(i)}$, as given in $$\phi(i) = i + (i \bmod I) \times (D-1) \qquad \text{Equation 3}$$

For a triangular interleaver defined in very high speed digital subscriber line (VDSL1) standard the possible block sizes are limited to values of I that divide the forward error correction (FEC) codeword, i.e. Reed-Solomon (RS) codeword length (N), i.e.: q=N/I has to be an integer. In the case where q is an integer each codeword (length N) consists of q blocks. Within each block the bytes are delayed following the rule given in equation 2.

Figure 3:
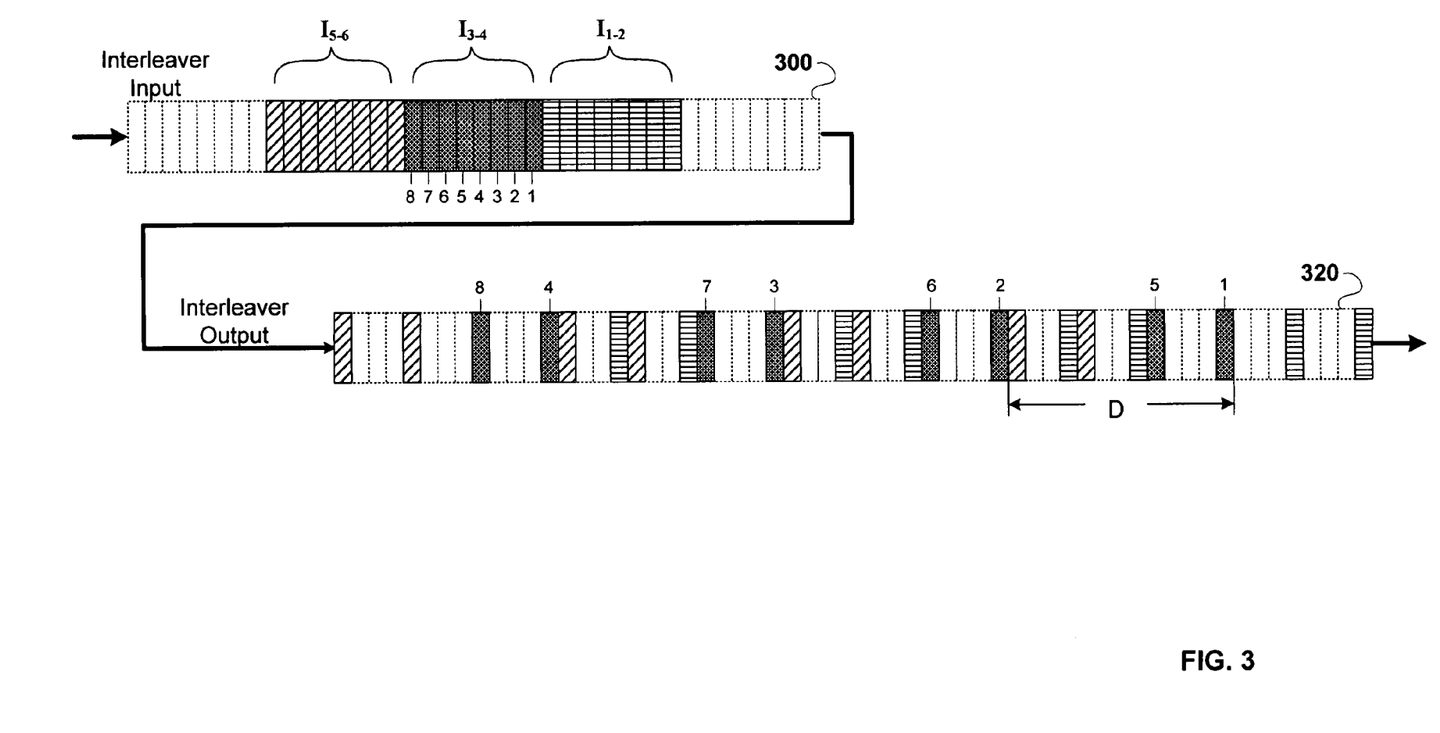
FIG. 3 is a data structure diagram showing representative interleaver input and output streams.

FIG. 3 is a data structure diagram showing representative interleaver input and output streams. In a triangular interleaver bytes within the same interleaver block (i.e. bytes within the same "column" in FIG. 2 are a distance D apart after interleaving. Bytes that have the same block index, but belong to consecutive interleaver blocks (i.e. bytes within the same "row" in FIG. 2) are a distance I apart after interleaving. Thus interleaving distributes the bytes within a codeword as illustrated in FIG. 3. The bytes along a "row" are all clustered within a distance D, at intervals of length I. In the particular example shown in FIG. 3 the codeword size, N=8; the interleaver block length, I=4; and the interleaver depth parameter, M=3. Thus 'q'=N/I=2; and the to interleaver depth, D=13. An error burst of length D will affect at most two bytes from each codeword. Error correction capability has to be dimensioned for correcting 2 bytes per codeword.

This in turn means that after interleaving, any set of D consecutive bytes contains at most q bytes belonging to the same codeword. Consequently, this also means that any noise burst of length D will affect at most q bytes per codeword. If the correction capability of the RS code is chosen appropriately (i.e. q or higher), the RS coding will be able to correct the error burst completely.

Figure 4A:
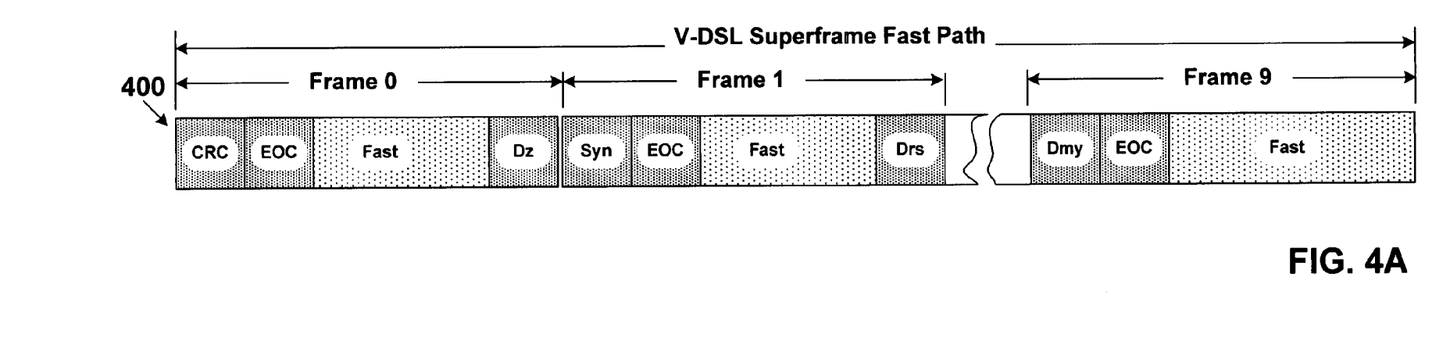
FIGS. 4A-4B are data structure diagrams showing representative fast and interleaved frame structures for a representative VDSL datastream.
Figures 4B, 5:
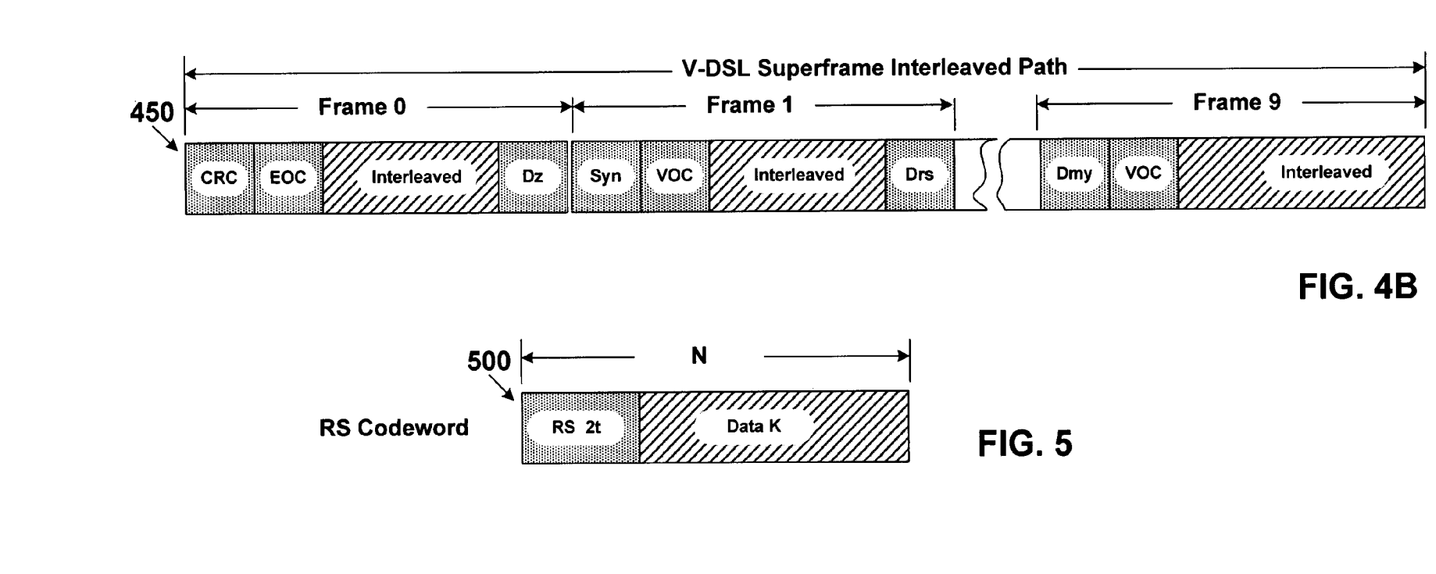
FIG. 5 is a data structure diagram of a representative' forward error correction codeword.

FIGS. 4A-4B are data structure diagrams showing representative V-DSL super frames 400 and 450 with fast path and interleaved path data respectively.

FIG. 5 is a data structure diagram of a representative forward error correction codeword 500 of the block type. Reed-Solomon and other block codeword types contain payload data of K bytes and so called FEC overhead in the form of R parity bytes, a.k.a. "redundancy" bytes in each codeword. The latter to assist the receiver in recovering errored codewords of length N=K+R bytes. Typically N must be 255 or less even numbered bytes.

Figure 6:
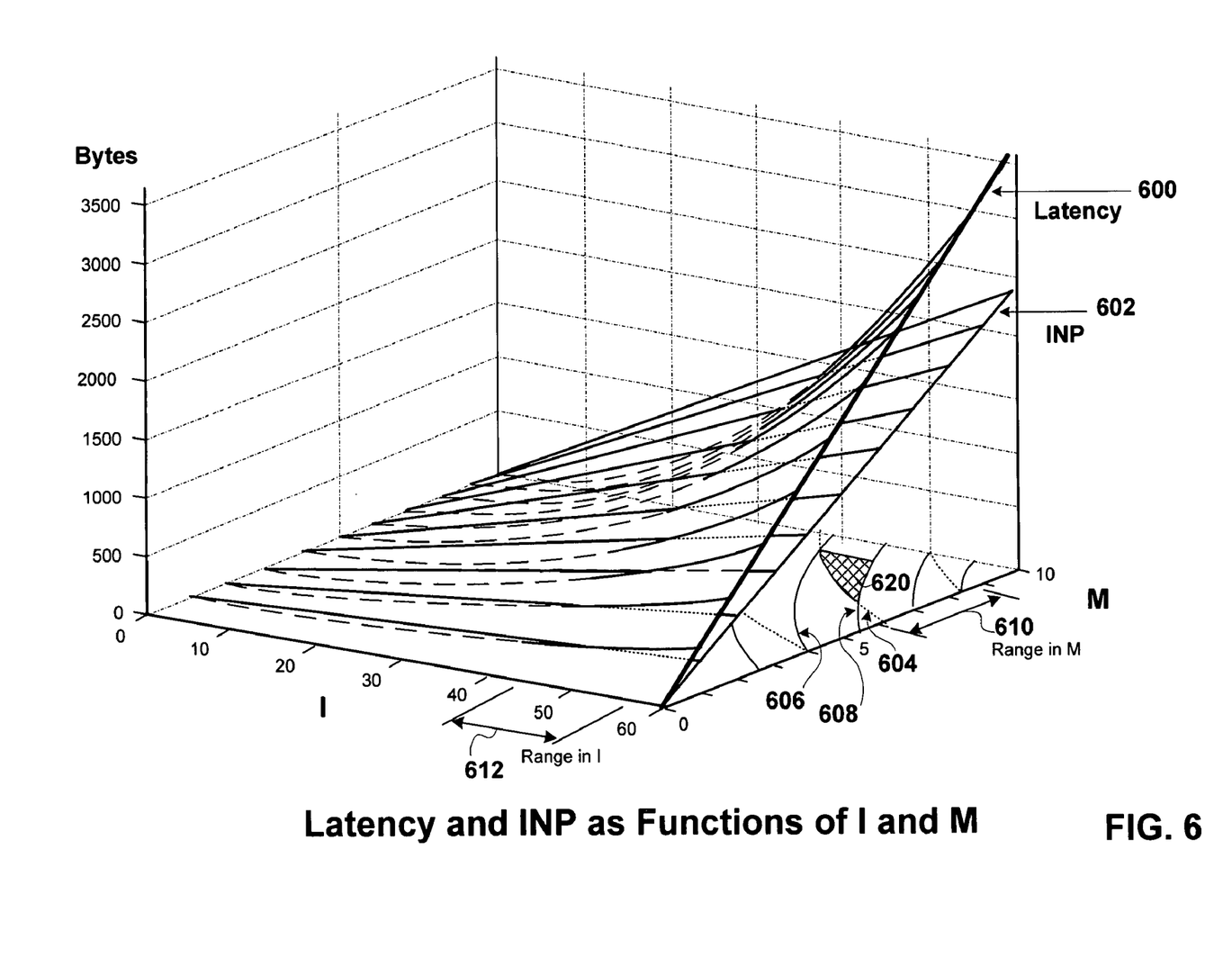
FIG. 6 is a graph of latency and impulse noise protection surfaces as a function of interleaver block size and depth parameters.

FIG. 6 is a graph of a representative pair of latency and impulse noise protection (INP) surfaces 600 and 602 respectively. These surfaces are expressed as a function of interleaver block size I and depth M parameters. In prior art systems, optimization of interleaver parameters and codeword parameters with which they are linked typically involves a so called 'brute' force approach with evaluation of in four-dimensional space defined by the interleaver parameters I,M and by the codeword parameters R,N. This brute force approach is conducted over the I×M×R×N nodes of the four-dimensional space. This prior art approach typically results in lengthy solution intervals and a tendency to settle for sub-optimal solutions, to attenuate the solution interval.

The current invention provides an approach which can be configured for full or partial characterization the solution space to reduce the number of nodes evaluated with that the result that little or no iteration is required to find an optimal solution to I,M,R,N to meet the various standard specified constraints, operator specified constraints, and channel constraints. The solid lines 606,608 and dashed lines 604 on the baseplane of the graph correspond to contour lines for the latency and INP surfaces respectively. These contour lines correspond with the projection of nodes of equal magnitude on the corresponding latency and INP surfaces. The latency surface is exponential in I. The solid contour lines 606 and 608 correspond with the minimum and maximum operator specified latencies for a given communication session. The dashed line 604 corresponds to a impulse noise protection (INP) floor also specified by the operator. The nodes that are evaluated for this set of latency and INP surfaces are limited to the targeted portion of the solution space defined by the cross-hatched area 620 with varying ranges in I, e.g. range 612, for each corresponding range in M, e.g. range 610. This reduction in solution space results from the characterization of the range of I and M in which optimal solutions will fall before evaluation of the actual node parameters. In embodiments of the invention in which partial solution space characterization is implemented, the range in I only will be determined. In embodiments of the invention in which full solution space characterization is implemented both the range in I and M will be determined for a given set of latency and INP surfaces.

Characterization of the Target Portion of the Solution Space

We want to select the interleaver parameters such that the following constraints are met (simultaneously) on the system level:
1. The system is able to correct burst errors caused by impulses of a given maximum length (required protection capability)
2. The extra induced latency is lower than a given maximum allowed latency
3. The extra induced latency is higher than a given minimum required latency We consider a triangular interleaver. This type of interleaver is determined by the values of the two parameters M(interleaving depth parameter) and/(interleaver block size). For a triangular interleaver, the actual correction capability and the actual latency (in bytes) as a function of M and/are given by the following expressions:

$$\text{Actual correction} = \lfloor t/q \rfloor \times (M \times I + 1) \qquad \text{Equation 4}$$

$$\text{Actual latency} = M \times I \times (I-1) \qquad \text{Equation 5}$$

We further assume that the used RS codeword (N,K) has a correction capability t and that the ratio N/I is an integer (q).

The search for appropriate interleaver parameters is a search for two integers M and I such that the following constraints are met:

$$M \times I \geq \alpha \qquad \text{Equation 6}$$

$$\beta_1 \leq M \times I \times (I-1) \leq \beta_2 \qquad \text{Equation 7}$$

Where $\alpha$, $\beta_1$ and $\beta_2$ are easily calculated from the required protection capability and the minimum and maximum allowed latency:

$$\alpha\square = (\text{required correction} * lbr/8)/(t/q) - 1$$

$$\beta_1 = \text{minimum latency} * lbr/8$$

$$\beta_2 = \text{maximum latency} * lbr/8,$$

where lbr is the bit rate on the line.

Once $\alpha$, $\beta_1$ and $\beta_2$ have been calculated, the problem is entirely reduced to finding the integer values that fulfill the constraints of equations 6 and 7.

Equation 7 is equivalent to:

$$M \times I \times (I-1) - \beta_1 \geq 0 \qquad \text{Equation 8a}$$

$$M \times I \times (I-1) - \beta_2 \leq 0 \qquad \text{Equation 8b}$$

Equations 8a,8b are essentially quadratic equations in I. Since M is always positive, the coefficient of the quadratic term of these equations is positive. For a quadratic equation with positive highest coefficient, the following properties hold true:

1. The function value is negative for values of I that lie between the zeros of the quadratic function
2. The function value is positive for values of I that are lower than the smallest zero or larger than the largest zero of the quadratic function The zeros of equation (8a) are given by:

$$I_{\pm}^{(a)}(M) = \frac{1 \pm \sqrt{1 + \frac{4\beta_1}{M}}}{2} \quad \text{Equation 9}$$

The zeros of equation (8b) are given by:

$$I_{\pm}^{(b)}(M) = \frac{1 \pm \sqrt{1 + \frac{4\beta_2}{M}}}{2} \quad \text{Equation 10}$$

Since values of I obviously have to be positive, only the positive solutions are important. Given the above properties of quadratic equations, we find that inequalities of Equations 8a and 8b are simultaneously fulfilled for values of I that are bounded by:

$$I_{+}^{(a)}(M) \leq I \leq I_{+}^{(b)}(M) \quad \text{Equation 11}$$

Equation 11 is the basis of a simplified search algorithm that solves the inequalities of equations 8a and 8b. Instead of a search over all values of I and M, the search has been reduced to a one-dimensional search over the values of M only. The range of M typically goes from 1 to about 60. For any value of M, one simply has to verify that an integer is contained in the interval between $I_{+}^{(a)}(M)$ and $I_{+}^{(b)}(M)$. If this is the case, that integer is the value of I and the pair (M,I) is a solution to Equation 7. This significantly reduces the search space.

Not every combination of I and M that is found in this way will also be a solution to the other inequality expressed in equation 6. However, equation 6 can easily be expressed as a constraint on M as:

$$M \frac{1 + \sqrt{1 + \frac{4\beta}{M}}}{2} \geq \alpha \quad \text{Equation 12}$$

Or, equivalently:

$$M \geq \frac{\alpha^2}{\beta + \alpha} \quad \text{Equation 13}$$

for which $\beta = \beta_1$ results in a sufficient condition and $\beta = \beta_2$ results in a necessary condition.

In other words: the search for a solution (I, M) that fulfills Equations 8a, 8b and 6 simultaneously is still a one-dimensional search over values of M, but the range of M will be further restricted. As a result, the one-dimensional search space becomes even smaller.

The derivation of equation 13 is as follows:

$$M \frac{1 + \sqrt{1 + \frac{4\beta}{M}}}{2} \geq \alpha$$

If properly rewritten, this is actually a linear equation in M. Divide both sides by M and multiply both sides by 2:

$$1 + \sqrt{1 + \frac{4\beta}{M}} \geq \frac{2\alpha}{M}$$

Subtract 1 from both sides:

$$\sqrt{1 + \frac{4\beta}{M}} \geq \frac{2\alpha}{M} - 1$$

Square both sides:

$$1 + \frac{4\beta}{M} \geq \left(\frac{2\alpha}{M} - 1\right)^2$$

Expand the square on the right-hand side:

$$1 + \frac{4\beta}{M} \geq \frac{4\alpha^2}{M^2} - 4\frac{\alpha}{M} + 1$$

Subtract 1 from both sides:

$$4\beta M \geq 4\alpha^2 - 4\alpha M$$

Bring second term on the right to the left:

$$4\beta M + 4\alpha M \geq 4\alpha^2$$

$$4(\beta + \alpha)M \geq 4\alpha^2$$

Solve for M:

$$M \geq \frac{\alpha^2}{\beta + \alpha}$$

Further Restrictions on M

The requirement expressed in equation 6 has already restricted the range of M values that has to be investigated. This range can be even further restricted, by imposing the following additional constraints:

1. Maximum allowed value of I
2. Minimum required coding efficiency

Some solutions for I are not usable in practice, since I is expected to be a divisor of the RS codeword length. Depending on the value of g, values of I larger than floor of 255/q do not fit within the maximum RS codeword length of 255 bytes. These values should therefore be discarded. This again results in a restriction of the range of M that needs to be investigated. If I is required to be smaller than $I_{max}$, one easily finds:

$$M \geq \frac{4\beta}{(I_{max}-1)^2-1} \qquad \text{Equation 14}$$

for which $\beta=\beta_1$ results in a necessary condition and $\beta\square=\beta_2$ results in a sufficient condition.

The derivation of Equation 14 is as follows.

The max codeword size limits us to a max value of I. From this, a bound on M can be determined.

Since:

$$I \leq I_{max}$$

Using expression for 1 as function of M:

$$\frac{1+\sqrt{1+\frac{4\beta}{M}}}{2} \leq I_{max}$$

Multiply both sides by 2 and subtract 1

$$\sqrt{1+\frac{4\beta}{M}} \leq 2I_{max}-1$$

Square both sides:

$$1+\frac{4\beta}{M} \leq (2I_{max}-1)^2$$

Subtract 1 from both sides:

$$\frac{4\beta}{M} \leq (2I_{max}-1)^2-1$$

Solve for M:

$$M \geq \frac{4\beta}{(2I_{max}-1)^2-1}$$

If I is a divisor to the RS codeword length (N=qI), the overhead is given by:

$$OH = \frac{t}{q}\frac{2}{I} \qquad \text{Equation 15}$$

If we want to restrict the search to values of I that will result in a minimum RS coding overhead, we therefore only have to consider $I \geq I_{min}$, with $$I_{min} = \frac{t}{q}\frac{2}{OH_{max}} \qquad \text{Equation 16}$$

This again translates into a restriction on the values of M. One easily finds:

$$M \leq \frac{4\beta}{(2I_{min}-1)^2-1} \qquad \text{Equation 17}$$

for which $\beta\square=\beta_1$ results in a sufficient condition and $\beta\square=\beta_2$ results in a necessary condition.

The derivation of equation 17 follows:

We require that all I are larger than a minimum value $I_{min}$, determined by the desired $OH_{max}$.

$$I_{min} = \frac{t}{q}\frac{2}{OH_{max}}$$

Therefore:

$$I \geq I_{min}$$

Using expression for I as function of M:

$$\frac{1+\sqrt{1+\frac{4\beta}{M}}}{2} \geq I_{min}$$

Multiply both sides by 2 and subtract 1

$$\sqrt{1+\frac{4\beta}{M}} \geq 2I_{min}-1$$

Square both sides:

$$1+\frac{4\beta}{M} \geq (2I_{min}-1)^2$$

Subtract 1 from both sides:

$$\frac{4\beta}{M} \geq (2I_{min}-1)^2-1$$

Solve for M:

$$M \leq \frac{4\beta}{(2I_{min}-1)^2-1}$$

The search process is equivalent to a one-dimensional search over a limited number of M-values. As a first step, one has to determine the minimal and maximal value of M that need to be investigated.

Next, for each M-value one has to calculate $I_+^{(a)}(M)$ and $I_+^{(b)}(M)$ and verify whether an integer is contained in the interval $[I_+^{(a)}(M), I_+^{(b)}(M)]$. If this is the case, that integer is the value of I and the pair (M,I) is a solution.

EXAMPLE

In this section, an example is given for a practical case. We assume the following requirements:
1. The line bit rate (lbr) is equal to 5 Mbps;
2. The required latency should be contained between 9.5 msec and 10 msec;
3. The required correction capability is 250 microseconds; and
4. The RS coding overhead should be lower than 10%

Step 1: Calculate the Values of $\alpha$, $\beta_1$ and $\beta_2$

We'll start the search for t/q=1. In that case we find:

$\beta_1 = 5937.5$ $\beta_2 = 6250$ $\alpha = 155.25$

Step 2: Find the Constraints on M

Using the inequalities in equations 13, 14 and 17, we find that the search can be limited to the values of M from 7 to 16. For all inequalities, we have assumed the necessary conditions.

Note that with this we have reduced a possibly exhaustive search over M and I to a search over 10 values.)

Step 3: Calculate $I_+^{(a)}(M)$ and $I_+^{(b)}(M)$

Calculate the values of $I_+^{(a)}(M)$ and $I_+^{(b)}(M)$ and determine the values of M for which an integer is contained between them. This calculation is summarized in Table 1.

TABLE 1 calculation of $I_+^{(a)}(M)$ and $I_+^{(b)}(M)$

| M | $I_+^{(a)}(M)$ | $I_+^{(b)}(M)$ | Integer in interval |
|---|---|---|---|
| 7 | 29.6284 | 30.3849 | 30 |
| 8 | 27.7477 | 28.4553 | 28 |
| 9 | 26.1899 | 26.8571 | — |
| 10 | 24.8721 | 25.5050 | 25 |
| 11 | 23.7384 | 24.3418 | 24 |
| 12 | 22.7495 | 23.3272 | 23 |
| 13 | 21.8771 | 22.4322 | 22 |
| 14 | 21.0999 | 21.6348 | — |
| 15 | 20.4018 | 20.9185 | — |
| 16 | 19.7703 | 20.2706 | 20 |

From Table 1, one can immediately read off the solutions for M and I. Every time an integer is found in the interval, we have a valid solution for (M,I).

As a check, one can verify explicitly that for M=9, 14 and 15, there is no value of I such that MI (I−1) is between $\beta_1$ and $\beta_2$.

The actual latency and correction capability for the solutions in Table 1 are shown in Table 2. All solutions meet the correction and latency requirements, as well as the minimal efficiency requirement.

TABLE 2

Actual latency and correction capability for the solutions in Table 1

| (M, I) | Actual latency (msec) | Actual correction (usec) | Actual efficiency |
|---|---|---|---|
| (7,30) | 9.74 | 337.6 | 93.33% |
| (8,28) | 9.68 | 360.0 | 92.86% |
| (10,25) | 9.60 | 401.6 | 92.00% |
| (11,24) | 9.72 | 424.0 | 91.67% |
| (12,23) | 9.72 | 443.2 | 91.30% |
| (13,22) | 9.61 | 459.2 | 90.91% |
| (16,20) | 9.73 | 513.6 | 90.00% |

From this set of solutions, one can still choose to optimize for efficiency, correction capability or latency. Note also that the actual correction is monotonically increasing function of M, while the actual latency is not.

Figure 7:
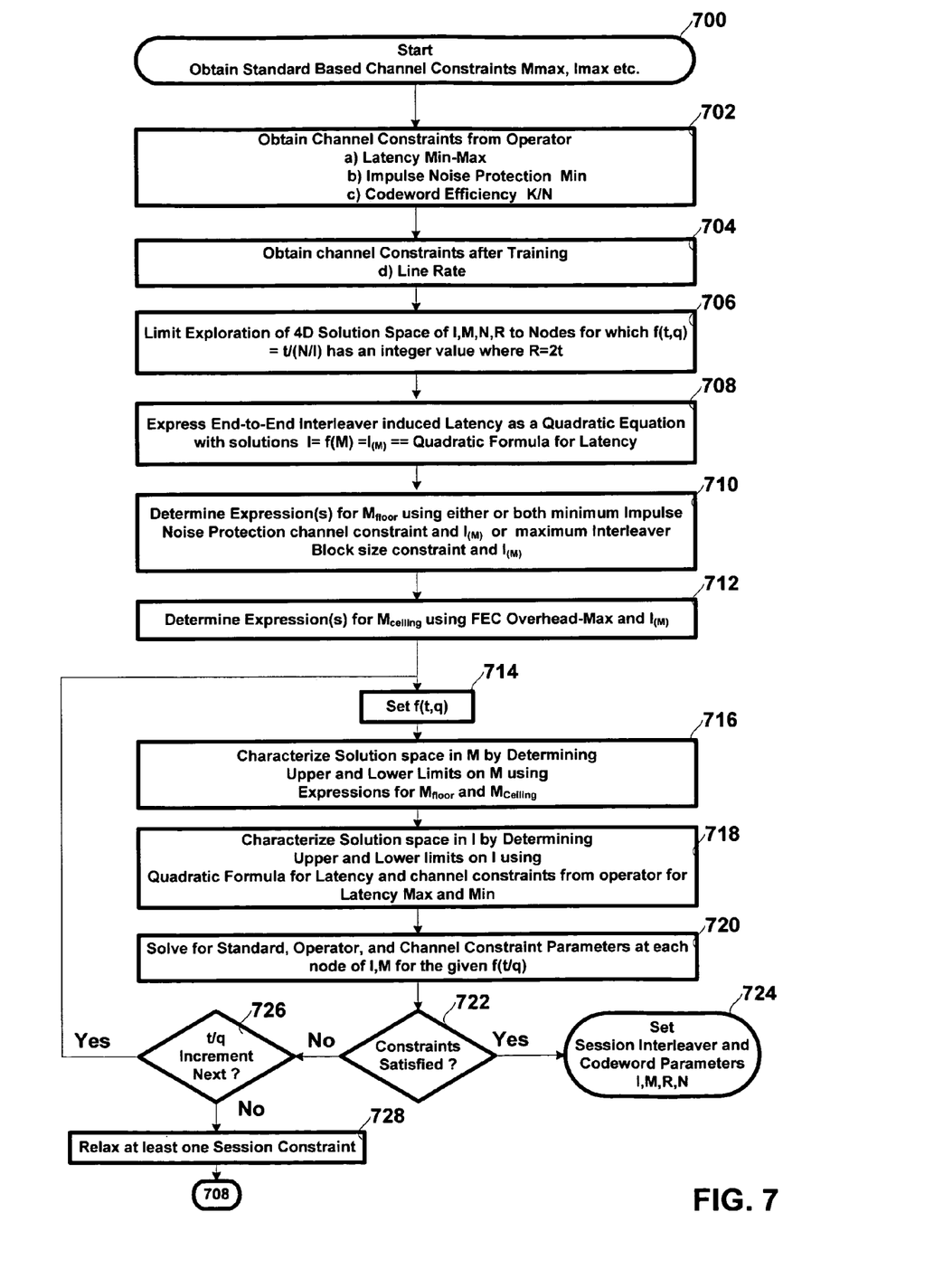
FIG. 7 is a process flow diagram of the codeword interleaver determination processes in accordance with an embodiment of the invention.

FIG. 7 is a process flow diagram of the codeword interleaver determination processes in accordance with an embodiment of the invention. These processes in an embodiment of the invention, are implemented in the processor 132 shown in FIG. 1.

In start process 700 the standard based communication channel performance constraints are determined. These typically include: constraints on interleaver depth parameter, e.g. Mmax; on the interleaver block size, e.g. Imax, on the FEC codeword size, e.g. Nmax, etc. Next in process 702 the channel based communication channel performance constraints from the communication system operator are obtained. These include: end-to-end latency minimum and maximum; impulse noise protection minimum; FEC codeword efficiency K/N, etc. Next in process 704 channel based communication channel performance constraints established after training, such as the line rate are determined. Then in process 706 the solution space is limited to I, M, N, R nodes for which f(t,q)=t/(N/I) has an integer value where R=2t. Next in process 708 the end-to-end interleaver induced latency is expressed as a quadratic equation with solutions I=f(M)=I (M)==Quadratic Formula for Latency.

Once 'I' has been characterized in terms of M, control passes to process 710. In process 710 expressions for Mfloor using either or both minimum impulse noise protection (INP-minimum) channel constraint and I(M) or using maximum interleaver block size Imaximum constraint and I(M) are determined. Then in process 712 expression(s) for Mceiling using FEC overhead maximum and I(M) are determined. Control is then passed to process 714.

In process 714 f(t,q) is set to a selected positive integer value, for example from 1-8. Then control is passed to process 716 in which the solution space in M, the interleaver depth parameter, is characterized by the upper and lower limits on M using the expressions for Mfloor and Mceiling determined in processes 710-712 above. Next in process 718 the solution space in I, the interleaver block size, is characterized by determining the upper and lower limits on I using the quadratic formula for latency as determined in process 708 and the channel constraints from the operator for maximum and minimum end-to-end latency as determined in process 702. With the four-dimensional solution space in I, M, N, R thus characterized to a limited set of nodes, control passes to process 720.

In process 720 one or more nodes in the targeted portion of the solution space is evaluated to determine all the resulting standard specified, operator specified, and channel constraints for the targeted node(s) for the given f(t/q). Then in decision process 722 a determination is made as to whether all communication channel performance constraints are satisfied. If they are control passes to process 724 with the coefficients for I, M, N, R at the of the qualifying node used to set the corresponding interleavers, deinterleavers, encoders and decoders on the transmitting and receiving modems or other communication devices. Alternately if the constraints are not satisfied control passes to decision process 726. In decision process 726 a determination is made as to whether incrementing t/q to the next integer value is appropriate, or if a standard specified ceiling has been reached for that parameter. If t/q can be incremented control passes to process 714 where t/q is incremented to the next integer value. Alternately, if the entire target solution space for the integer range of t/q has been evaluated with no resultant solution then control passes to process 728. In process 728 one or more specified communication channel performance constraints may be relaxed, and control returns to process 708.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A modem having shared and discrete components forming a transmit path and a receive path configured to couple to a communication medium for establishing a communication channel thereon, and the modem comprising:
    a forward error correction (FEC) encoder component on the transmit path, and the FEC encoder component having configurable codeword length 'N' and redundancy 'R' parameters for the FEC encoding of the communication channel into codewords;
    an interleaver component coupled to the FEC encoder component for interleaving the codewords, and the interleaver component having configurable interleaver block length 'I' and interleaver depth 'M' parameters; and
    a processor coupled to the transmit and receive path components including the FEC encoder and interleaver components and the processor configured to characterize a FEC codeword and interleaver solution space in terms of a quadratic formula for latency which expresses interleaver block length 'I' as a function of the interleaver depth parameter 'M' from which expression targeted portions of the solution space may be identified prior to evaluation of the magnitude of the coefficients of the corresponding nodes thereof for compliance with communication channel performance constraints.

2. A modem having shared and discrete components forming a transmit path and a receive path configured to couple to a communication medium for establishing a communication channel thereon, and the modem comprising:
    a forward error correction (FEC) encoder component on the transmit path, and the FEC encoder component having configurable codeword length 'N' and redundancy 'R' parameters for the FEC encoding of the communication channel into codewords;
    an interleaver component coupled to the FEC encoder component for interleaving the codewords, and the interleaver component having configurable interleaver block length 'I' and interleaver depth 'M' parameters; and
    a processor coupled to the transmit and receive-path components including the FEC encoder and interleaver components and the processor configured to characterize a FEC codeword and interleaver solution space in terms of a minimum value for the interleaver depth parameter 'M' based on at least one of a minimum required impulse noise protection constraint and a maximum interleaver block size constraint from which expression targeted portions of the solution space may be identified prior to evaluation of the magnitude of the coefficients of the corresponding nodes thereof for compliance with communication channel performance constraints.

3. A modem having shared and discrete components forming a transmit path and a receive path configured to couple to a communication medium for establishing a communication channel thereon, and the modem comprising:
    a forward error correction (FEC) encoder component on the transmit path, and the FEC encoder component having configurable codeword length 'N' and redundancy 'R' parameters for the FEC encoding of the communication channel into codewords;
    an interleaver component coupled to the FEC encoder component for interleaving the codewords, and the interleaver component having configurable interleaver block length 'I' and interleaver depth 'M' parameters; and
    a processor coupled to the transmit and receive path components including the FEC encoder and interleaver components and the processor configured to characterize a FEC codeword and interleaver solution space in terms of a maximum value for the interleaver depth parameter 'M' based on a maximum FEC overhead constraint, from which expression targeted portions of the solution space may be identified prior to evaluation of the magnitude of the coefficients of the corresponding nodes thereof for compliance with communication channel performance constraints.

4. A method for codeword interleaver parameter determination in a modem configured to couple to a communication medium for establishing a communication channel thereon; and the method comprising:
    providing a forward error correction (FEC) encoder having configurable codeword length 'N' and redundancy 'R' parameters for the FEC encoding of the communication channel into codewords;
    providing an interleaver for interleaving the codewords provided by the FEC encoder, and the interleaver having configurable interleaver block length 'I' and interleaver depth 'My parameters; and
    characterizing a FEC codeword and interleaver solution space in terms of expressions from which targeted portions of the solution space may be identified prior to evaluation of the magnitude of the coefficients of the corresponding nodes thereof for compliance with communication channel performance constraints,
    wherein the characterizing act further comprises:
    characterizing the FEC codeword and interleaver solution space in terms of a quadratic formula for latency which expresses interleaver block length 'I' as a function of interleaver depth parameter 'M'.

5. A method for codeword interleaver parameter determination in a modem configured to couple to a communication medium for establishing a communication channel thereon; and the method comprising:
    providing a forward error correction (FEC) encoder having configurable codeword length 'N' and redundancy 'R' parameters for the FEC encoding of the communication channel into codewords;
    providing an interleaver for interleaving the codewords provided by the FEC encoder, and the interleaver having configurable interleaver block length 'I' and interleaver depth 'My parameters; and
    characterizing a FEC codeword and interleaver solution space in terms of expressions from which targeted portions of the solution space may be identified prior to evaluation of the magnitude of the coefficients of the corresponding nodes thereof for compliance with communication channel performance constraints, wherein the characterizing act further comprises:

characterizing the FEC codeword and interleaver solution space in terms of a minimum value for the interleaver depth parameter 'M' based on at least one of a minimum required impulse noise protection constraint and a maximum interleaver block size constraint, prior to evaluation of the magnitude of the coefficients of the corresponding nodes thereof for compliance with communication channel performance constraints.

6. A method for codeword interleaver parameter determination in a modem configured to couple to a communication medium for establishing a communication channel thereon; and the method comprising:

providing a forward error correction (FEC) encoder having configurable codeword length 'N' and redundancy 'R' parameters for the FEC encoding of the communication channel into codewords;

providing an interleaver for interleaving the codewords provided by the FEC encoder, and the interleaver having configurable interleaver block length 'I' and interleaver depth 'My parameters; and characterizing a FEC codeword and interleaver solution space in terms of expressions from which targeted portions of the solution space may be identified prior to evaluation of the magnitude of the coefficients of the corresponding nodes thereof for compliance with communication channel performance constraints, wherein the characterizing act further comprises:

characterizing the FEC codeword and interleaver solution space in terms of a maximum value for the interleaver depth parameter 'M' based on a maximum FEC overhead constraint, prior to evaluation of the magnitude of the coefficients of the corresponding nodes thereof for compliance with communication channel performance constraints.

7. The modem of claim 1, wherein the processor is further configured, if the performance constraints are satisfied, setting values of one or more of the parameters 'N', 'R', 'I' and 'M' using the characterized solution space.

8. The modem of claim 2, wherein the processor is further configured, if the performance constraints are satisfied, setting values of one or more of the parameters 'N', 'R', 'I' and 'M' using the characterized solution space.

9. The modem of claim 3, wherein the processor is further configured, if the performance constraints are satisfied, setting values of one or more of the parameters 'N', 'R', 'I' and 'M' using the characterized solution space.

10. The method of claim 4, further comprising:

if the performance constraints are satisfied, setting values of one or more of the parameters 'N', 'R', 'I' and 'M' using the characterized solution space.

11. The method of claim 5, further comprising:

if the performance constraints are satisfied, setting values of one or more of the parameters 'N', 'R', 'I' and 'M' using the characterized solution space.

12. The method of claim 6, further comprising:

if the performance constraints are satisfied, setting values of one or more of the parameters 'N', 'R', 'I' and 'M' using the characterized solution space.

* * * * *

UNITED STATES PATENT AND TRADEMARK OFFICE
CERTIFICATE OF CORRECTION

PATENT NO. : 8,335,968 B1
APPLICATION NO. : 12/215000
DATED : December 18, 2012
INVENTOR(S) : Schelstraete It is certified that error appears in the above-identified patent and that said Letters Patent is hereby corrected as shown below:

On the Title Page, in Item (57), under "ABSTRACT", in Column 2, Line 9, delete "the to" and insert -- the --, therefor.

In the Specification

In Column 1, Line 65, delete "configurable to" and insert -- configurable --, therefor.

In Column 2, Line 34, delete "representative'forward" and insert -- representative forward --, therefor.

In Column 2, Line 56, delete "communications to" and insert -- communications --, therefor.

In Column 4, Line 23, delete "wired," and insert -- wired --, therefor.

In Column 5, Line 19, delete "the to" and insert -- the --, therefor.

In Column 6, Line 26, delete "latency" and insert -- latency. --, therefor.

In Column 7, Line 8, delete "function" and insert -- function. --, therefor.

In Column 7, Line 43, delete "of/and" and insert -- of *I* and --, therefor.

In Column 8, Line 65, delete "g," and insert -- q, --, therefor.

In Column 9, Line 18, delete "for 1" and insert -- for I --, therefor.

Signed and Sealed this
First Day of October, 2013

Teresa Stanek Rea
*Deputy Director of the United States Patent and Trademark Office*

CERTIFICATE OF CORRECTION (continued)
U.S. Pat. No. 8,335,968 B1

In the Claims:

In Column 14, Line 40, in Claim 4, delete "'My" and insert -- 'M' --, therefor.

In Column 14, Line 63, in Claim 5, delete "'My" and insert -- 'M' --, therefor.

In Column 15, Line 23, in Claim 6, delete "'My" and insert -- 'M' --, therefor.